United States Patent [19]

Shu

[11] Patent Number: 4,567,318
[45] Date of Patent: Jan. 28, 1986

[54] RF SHIELDED ELECTRONIC COMPONENT HOUSING

[75] Inventor: David F. Shu, Hoffman Estates, Ill.

[73] Assignee: TDS, Inc., Elk Grove Village, Ill.

[21] Appl. No.: 551,084

[22] Filed: Nov. 14, 1983

[51] Int. Cl.$^4$ .............................................. H05K 9/00
[52] U.S. Cl. .................................. 174/35 GC; 29/505; 29/525
[58] Field of Search .................. 174/35 R, 35 GC, 51; 29/426.5, 426.6, 428, 453, 469, 469.5, 505, 525, 514, 521, 613; 220/306, 307

[56] References Cited

U.S. PATENT DOCUMENTS 4,370,700 1/1983 Duddles et al. .............. 174/35 R X

Primary Examiner—A. T. Grimley
Assistant Examiner—D. A. Tone
Attorney, Agent, or Firm—Lockwood, Alex, Fitzgibbon & Cummings

[57] ABSTRACT

An RF shielded housing for a signal distribution system component includes a cast metal base member which forms an interior chamber in which circuit elements of the component are contained. An access aperture is provided on one wall of the housing to facilitate installation of the circuit elements within the chamber. The access aperture is closed by a cover plate which fits over the aperture into a flange portion provided in the base member around the periphery of the aperture. A number of closely-spaced sawtooth-shaped engaging elements integrally formed in the flange portion deform the cover plate as it is press fit into position against the flange portion to form a like number of closely-spaced mechanical and electrical engagements which hold the cover securely in place and prevent RF leakage from the circuit elements within the chamber.

19 Claims, 10 Drawing Figures

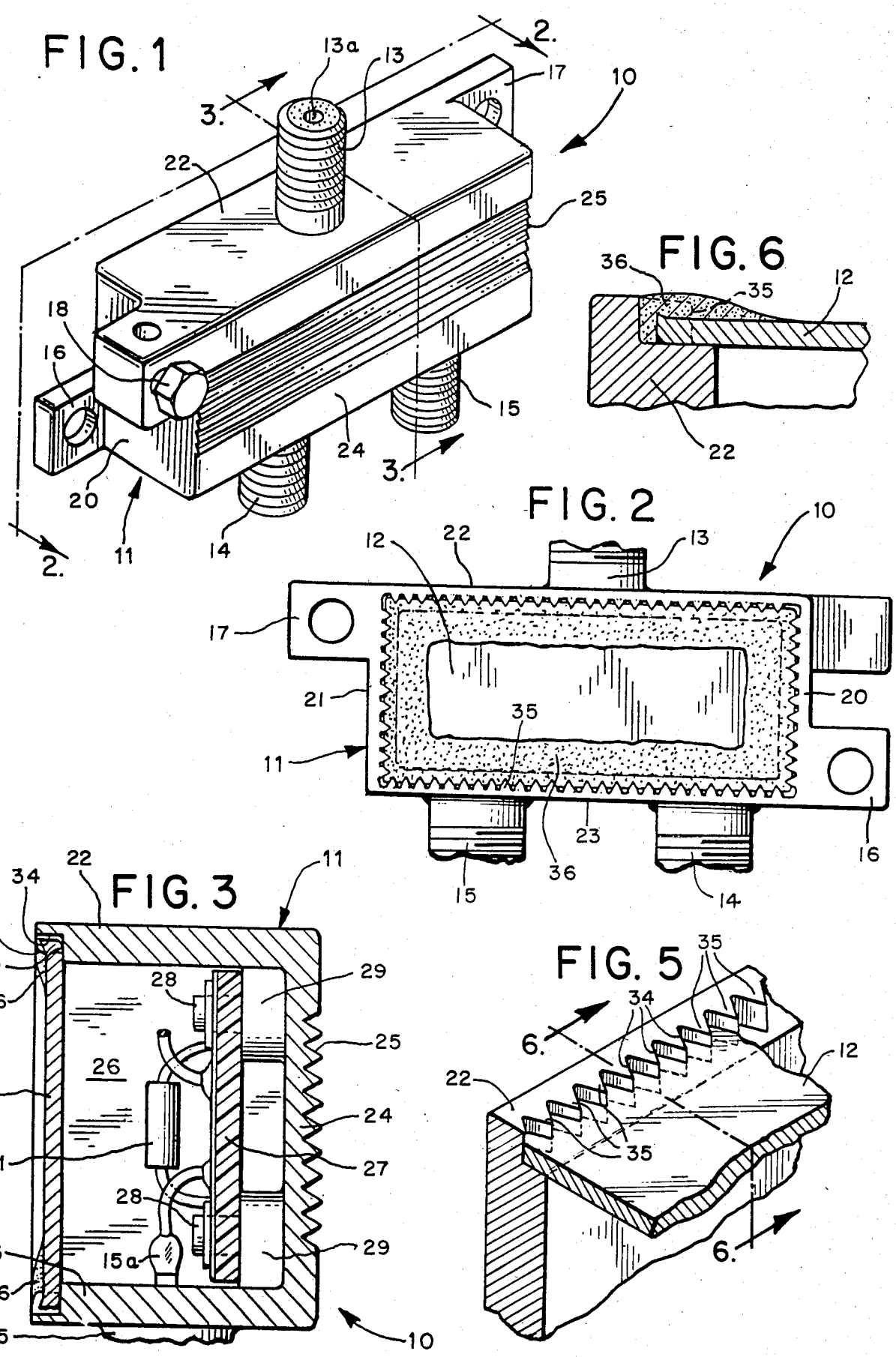

FIG. 8a
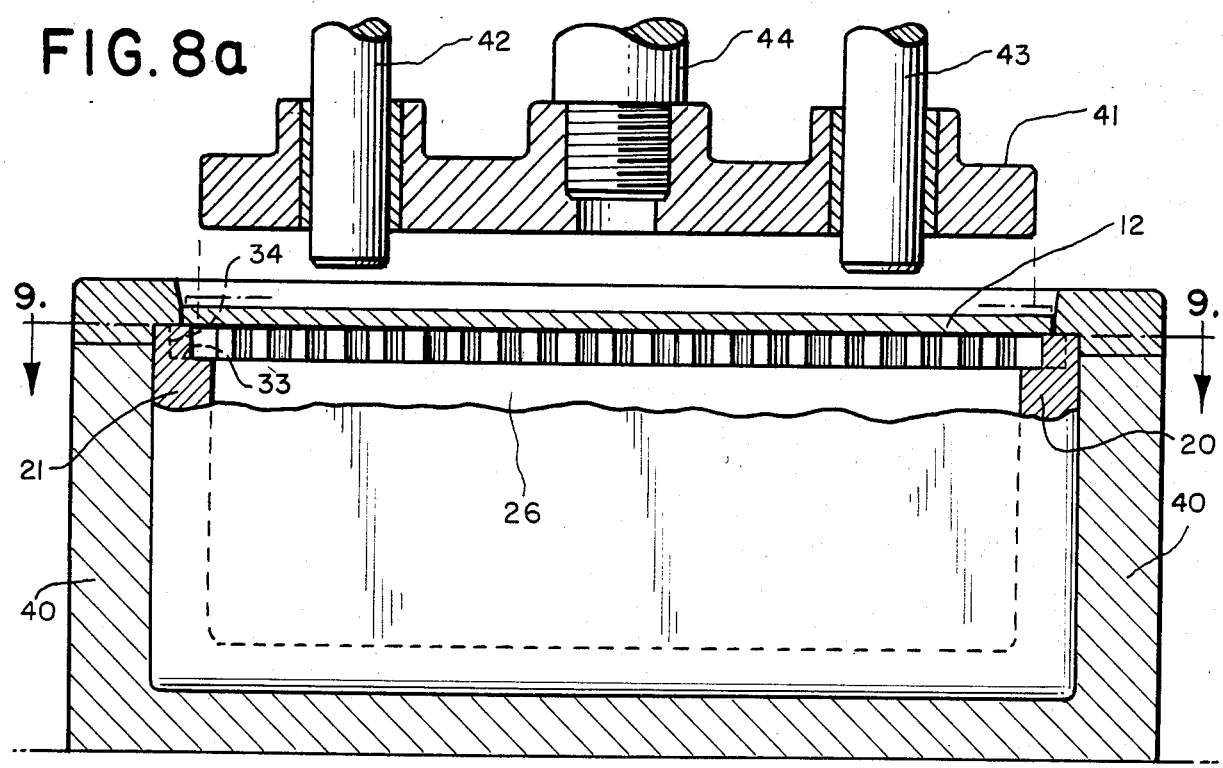
FIG. 8b
FIG. 9
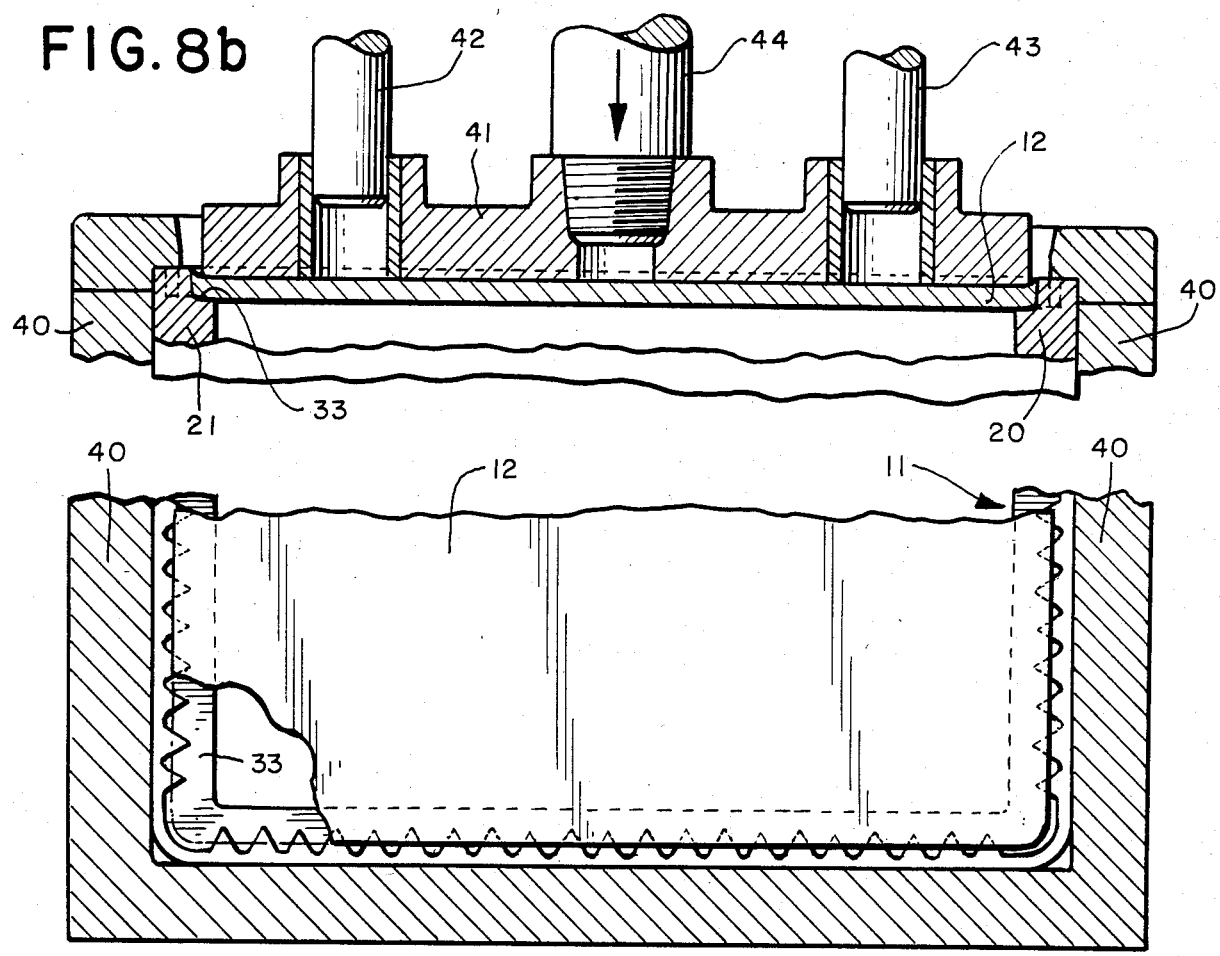

RF SHIELDED ELECTRONIC COMPONENT HOUSING

BACKGROUND OF THE INVENTION

The present invention relates generally to housings for electronic components, and more particularly, to housings for RF distribution system components such as signal splitters, filters, couplers, or directional taps and signal attenuators.

RF-sealed enclosures are frequently required for housing various circuits and components utilized in signal distribution systems, such as signal splitters, couplers, or directional taps, attenuators and filters. Typically, such housings include a cast metal base member which defines an interior chamber within which the elements of the circuit or component are contained. Connections are typically established with input and output cables by means of conventional RF-type connectors, which may be mounted on and extend through one or more walls of the base member, or which may be formed integrally with the base member. An access aperture is typically provided on one wall of the base member to provide access to the interior chamber during manufacture to facilitate installation of resistors, capacitors and other elements of the circuit or component.

After assembly, the access aperture is covered with a cover plate to close the chamber. To prevent damage to or repositioning of circuit elements within the chamber, it is desirable that this cover plate be securely fastened in position over the aperture. Furthermore, to prevent RF leakage from the circuit elements, particularly of the 5 to 1000 MHz frequency range signals with which signal distribution system components are utilized, it is desirable that the cover plate be electrically bonded to the base member around its entire periphery.

In previous component housing constructions, various methods are utilized for securing the cover plate in place. One construction provides for a continuous peripheral solder bead between the housing and the cover. While providing good RF shielding, this has the disadvantage of requiring the time consuming manufacturing procedures of heating the housing and applying the solder bead.

Another construction provides a number of individual crimp engagements between the cover plate and the base member at selected locations around the periphery of the cover plate. A bead of epoxy is then applied around the periphery of the cover plate to seal the enclosure. This arrangement has the disadvantage of leaving gaps between the crimp locations in which the cover plate and the base member are not electrically connected, thereby providing the possibility for RF leakage from circuit elements within the housing, especially at VHF and UHF frequencies.

The present invention overcomes these deficiencies by providing a plurality of closely spaced electrical and mechanical engagements between the base member and the cover plate around the entire periphery of the cover plate.

Accordingly, it is a general object of the present invention to provide a new and improved RF shielded housing for RF components such as signal splitters, couplers, directional taps, filters, attenuators and the like.

It is a more specific object of the present invention to provide an RF-sealed housing of the type having a base member and a cover plate, and an improved means of electrical and mechanical attachment of the cover plate to the base member.

It is a further object of the present invention to provide an RF shielded electronic component housing of improved electrical and mechanical construction which is economical to manufacture.

SUMMARY OF THE INVENTION

The present invention provides an electronic equipment housing of the type having a relatively non-deformable base member defining an interior chamber, and a relatively deformable cover plate which covers an access aperture providing access to the chamber. The cover plate is mechanically and electrically secured to the base member by a plurality of engaging members formed integrally with the base member on a ledge provided around the access aperture for receiving the cover plate. The cover plate is pressed onto the ledge such that the engaging members come into deforming electrical and mechanical engagement with the cover plate around the periphery of the cover plate. The spacing of the teeth is sufficiently close to preclude RF leakage between the points of engagement.

BRIEF DESCRIPTION OF THE DRAWINGS

The features of the present invention which are believed to be novel are set forth with particularity in the appended claims. The invention, together with the further objects and advantages thereof, can best be understood by reference to the following description taken in conjunction with the accompanying drawings, in the several figures of which like reference numerals identify like elements, and in which:

FIG. 1 is a perspective view of an RF shielded signal splitter component constructed in accordance with the invention.

FIG. 2 is a bottom view of the signal splitter component taken along line 2—2 of FIG. 1 showing the interior chamber formed therein.

FIG. 3 is an expanded cross-sectional view of the signal splitter component taken along line 3—3 of FIG. 1.

FIG. 5 is an enlarged fragmentary perspective view showing in detail the engagement between the base member and the cover plate along a representative portion of the periphery of the access aperture.

FIG. 6 is an enlarged cross-sectional view of the engagement detail taken along line 6—6 of FIG. 5.

FIG. 8a is an enlarged cross-sectional view of the signal splitter component and assembly press taken along line 8—8 of FIG. 7 showing the press in an open position.

FIG. 8b is a cross-sectional view of the signal splitter and assembly press similar to FIG. 8a showing the press in a closed position.

FIG. 9 is a cross-sectional view taken along line 9—9 of FIG. 8a showing the cover plate of the signal splitter component prior to compression by the assembly press.

DESCRIPTION OF THE PREFERRED EMBODIMENT

Figure 4:
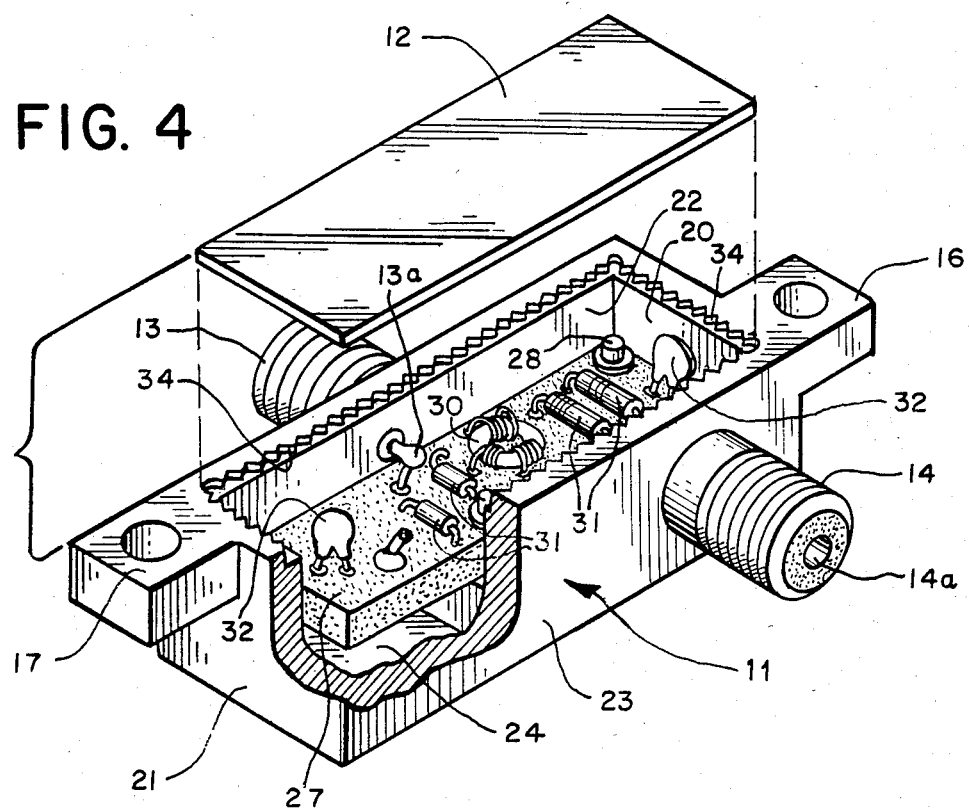
FIG. 4 is an enlarged partially exploded perspective view of the signal splitter component showing the base member, interior chamber, access aperture and cover plate thereof.

Referring to the Figures, and particularly to FIGS. 1–4, an RF-sealed electronic component housing 10 constructed in accordance with the invention is seen to comprise a generally rectangular base member 11 having an access aperture on one side thereof, and a generally rectangular cover plate 12 of complementary dimensions fitted over the access aperture to as to enclose and electrically shield the circuit elements within the enclosure. In the representative embodiment of the component housing illustrated, which comprises an RF signal splitter for use in a signal distribution system, electrical signals are conveyed to the circuitry within the housing by an RF input connector 13, and from the circuitry by a pair of RF output connectors 14 and 15. These RF connectors may be of various types, including F type or BNC type, and may be provided as separate elements mounted on the walls of base member 11, or may be integrally molded into the side walls. In accordance with conventional practice, the three illustrated F-type connectors 13–15 include center conductors 13a–15a, respectively, which establish electrical contact with the center conductors of coaxial cables (not shown) connected to the connectors. The connector conductors 13a–15a may be connected directly to printed wiring board 27, or to suspended circuit elements within the housing.

Apertured flange portions 16 and 17 at either end of the base member facilitate mounting the component housing 10 to a supporting surface. A grounding screw 18 may in addition be provided at one end of the base member to facilitate grounding the housing to an external ground bus.

The base member 11, which is preferably formed of a rigid electrically-conductive material, such as a zinc alloy, by means of conventional metal casting techniques, includes a pair of end walls 20 and 21, a pair of side walls 22 and 23, and a bottom wall 24. The bottom wall 24 may contain on its exterior surface a plurality of serrations or depressions 25 for component and connector identification or for other purposes.

The base member walls 20–24 together form an interior chamber 26 (FIG. 3) within which the circuit elements of the electronic component are contained. In the illustrated embodiment, which comprises a signal splitter for dividing an incoming signal into two separate output signals, necessary circuit elements are mounted on a printed wiring board 27 within the chamber. This circuit board is secured in a parallel-spaced position relative to bottom wall 24 by means of a pair of machine screws 28 which extend through the wiring board into threaded apertures (not shown) contained within mounting pillars 29 integrally formed in housing base member 11.

Depending on the particular function of the component 10, various circuit elements may be contained within chamber 26. In the present signal splitter component embodiment these include a toroidal transformer 30, a plurality of resistors 31 and a plurality of capacitors 32, all mounted on circuit board 27. Other component functions may require other circuit elements, including transistors and other active devices.

To provide a mechanically secure RF-sealed attachment for cover plate 12, the access aperture is provided with a peripheral ledge portion 33 within which the cover plate is received. As shown in the Figures, this ledge portion is dimensioned to receive the cover plate, so that when the cover plate is in position it completely encloses the interior chamber 26. The ledge portion 33 is formed by a peripheral side wall 34 (FIG. 3) which extends around the periphery of the access aperture.

In accordance with the invention, the cover plate 12 is electrically and mechanically secured in position by a plurality of tooth-like engaging elements 35 integrally formed in base member 11 on ledge portion 33. These elements, which are of the same relatively non-deformable material as base member 11, are in an interference relationship with the peripheral edge of cover plate 12 when the cover plate is seated on the ledge portion. Consequently, the cover plate 12, which is formed of an electrically conductive relatively deformable material, such as soft aluminum, is deformed at the points of interference, such that a plurality of mechanical and electrical points of engagement equal to the number of engaging elements is formed around the periphery of the cover plate, as shown in FIGS. 3, 5 and 6. These points of engagement are closely spaced so as to provide only minimal gaps substantially less than the wavelengths at which the component 10 operates between points of electrical contact, thereby preventing radiation of RF energy from the housing and consequent RF interference to nearby equipment.

Figure 7:
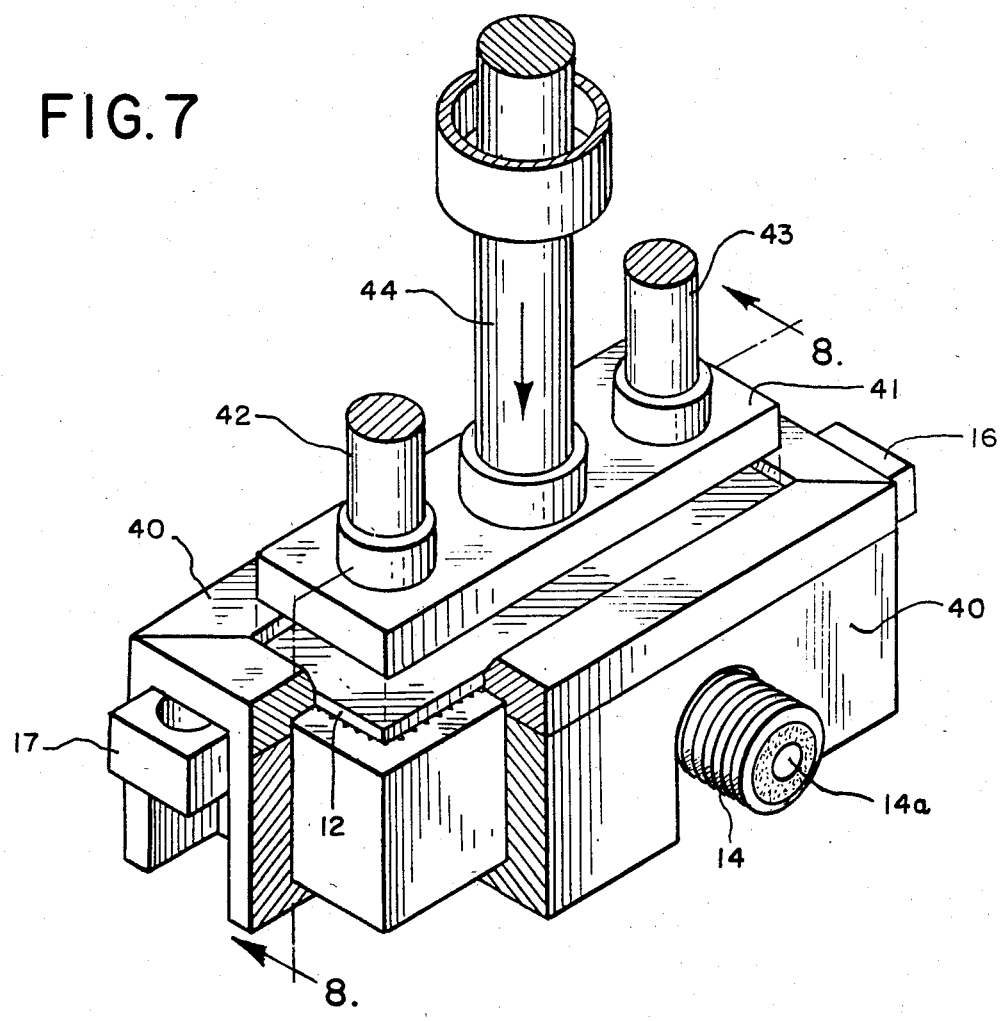
FIG. 7 is a perspective view of the signal splitter component of FIGS. 1-6 showing the component during assembly within an assembly press.

Deformation of the edges of cover plate 12 occurs during assembly of the housing. Initially, prior to installation of cover plate 12 circuit board 27 and the various electrical circuit element 30–33 of the component are mounted within chamber 26. Referring to FIG. 7, after all connections have been made, the cover plate 12 is installed by means of a conventional press apparatus, which may include a stationary die block 40 and a movable die 41. The base member 11 is positioned within the stationary die block 40 such that the access aperture is exposed to the movable die 41. Cover plate 12 is next positioned over the access aperture as shown in FIG. 8a. Die 41, which may be mounted for reciprocation in a conventional manner on a pair of guide rods 42 and 43, is forced down against cover plate 12 by a piston rod 44 in a conventional manner.

As shown in FIG. 8b, as the die 41 engages cover plate 12, the cover plate is forced down against ledge portion 33, causing the engaging elements 35 to deform the cover plate along the edge of the plate, as shown in FIGS. 5 and 6.

The base member 11 and cover plate 12 can be constructed from various materials, provided only that the material used for one of these elements is substantially more deformable or malleable than the material used for the other of the elements, and that the materials, or the coatings applied to the materials in the case of non electrically-conductive materials, provide good RF shielding characteristics. In one successful embodiment of the invention, the base member 11 is molded of Zamak No. 3 zinc die-casting alloy (Zamak is a trademark of The New Jersey Zinc Co.), and the cover plate 12 is formed of 1100 aluminum plate material. A layer of epoxy 36 is provided around the circumference of the cover plate to prevent corrosion and consequent leaking of the container.

Thus, an electronic component housing is formed which provides a high degree of mechanical integrity. The housing is assembled with only a single press operation without the necessity of soldering or multiple crimping operations. Because of the very close spacing made possible by the construction of the invention, a high degree of electrical integrity is obtained between the base member 11 and cover plate 12 to minimize RF leakage from or into the housing.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. An electronic component housing comprising:
   a base member defining an interior chamber opening to the exterior through an access aperture;
   a cover plate member dimensioned to extend over said access aperture;
   said base member including around the periphery of said access aperture a ledge portion dimensioned to receive said cover plate;
   one of said members being formed of a relatively non-malleable material, the other of said members being formed of a relatively malleable material; and
   said one of said members further including a plurality of engaging elements on said ledge portion in interference with said other of said members whereby said other of said members is deformed by said engaging elements to form a plurality of closely spaced mechanical and electrical engagement points providing a mechanical and electrically secure mounting for said cover plate member.

2. An electronic component housing as defined in claim 1 wherein said engaging elements are integrally formed with said base member.

3. An electronic component housing as defined in claim 1 wherein said engaging elements are formed as sawtooth-like members on said ledge portion.

4. An electronic component housing as defined in claim 3 wherein said engaging elements are integrally formed with said base member.

5. An electronic component housing as defined in claim 1 wherein said base member and said cover plate are formed of electrically conductive metals.

6. An electronic component housing as defined in claim 5 wherein said base member is formed of a moldable zinc alloy and said cover plate is formed of a soft aluminum material.

7. An electronic component housing comprising:
   a base member formed of a relatively non-deformable electrically conductive material defining an interior chamber opening to the exterior through an access aperture;
   an electrically conductive cover plate formed of a relatively deformable material dimensioned to extend over said access aperture;
   said base member including around the periphery of said access aperture a ledge portion dimensioned to receive said cover plate; and
   said base member further including a plurality of engaging elements on said ledge portion in interference with the rim of said cover plate, said cover plate being deformed by said engaging elements to form a plurality of closely spaced mechanical and electrical engagement point providing a mechanical and electrically secure mounting for said cover plate.

8. An electronic component housing as defined in claim 7 wherein said engaging elements are integrally formed with said base member.

9. An electronic component housing as defined in claim 7 wherein said engaging elements are formed as sawtooth-like members of said ledge portion.

10. An electronic component housing as defined in claim 9 wherein said engaging elements are integrally formed with said base member.

11. An electronic component housing as defined in claim 7 wherein said base member and said cover plate are formed of electrically conductive metals.

12. An electronic component housing as defined in claim 11 wherein said base member is formed of a moldable zinc alloy and said cover plate is formed of a soft aluminum material.

13. An electronic component housing comprising:
   a base member cast of a relatively non-malleable material defining an interior chamber opening to the exterior through an access aperture;
   a cover plate member formed of a relatively malleable material dimensioned to extend over said access aperture;
   said base member including around the periphery of said access aperture a flange portion dimensioned to receive said cover plate; and
   said base member further including a plurality of closely spaced integrally formed engaging elements on said flange portion arranged for engaging said cover plate on said flange portion whereby said cover plate is mechanically and electrically secured to said base member.

14. An electronic component housing as defined in claim 13 wherein said engaging elements are formed as sawtooth-like members on said flange portion.

15. An electronic component housing as defined in claim 13 wherein said base member and said cover plate are formed of electrically conductive metals.

16. An electronic component housing as defined in claim 15 wherein said base member is formed of a moldable zinc alloy and said cover plate is formed of a soft aluminum material.

17. The method of forming an electronic component housing of the type having a base member defining an interior chamber for containing circuit elements of the component and an access aperture providing access to the chamber, and of the type further having a cover plate member for electrically and mechanically closing the access aperture, one of the members being relatively malleable and the other of the members being relatively non-malleable, comprising the steps of:
   forming a flange portion along the access aperture for receiving the cover plate and a plurality of engaging elements on one member for interfering engagement on the flange portion with the other member when the cover plate member is seated in the access aperture; and
   pressing the cover plate member onto the flange portion whereby the engaging elements on the one member engage and deform the other member about its periphery to electrically and mechanically secure the cover plate.

18. The method of forming an electronic component housing as defined in claim 17 wherein the engaging element is integrally formed with the base member.

19. The method of forming an electronic component housing as defined in claim 18 wherein the engaging element is formed as a sawtooth-like element.

* * * * *